United States Patent [19]

Moran

[11] 4,397,724
[45] Aug. 9, 1983

[54] APPARATUS AND METHOD FOR PLASMA-ASSISTED ETCHING OF WAFERS

[75] Inventor: Joseph M. Moran, Berkeley Heights, N.J.

[73] Assignee: Bell Telephone Laboratories, Incorporated, Murray Hill, N.J.

[21] Appl. No.: 295,839

[22] Filed: Aug. 24, 1981

[51] Int. Cl.³ .............................................. C23C 15/00
[52] U.S. Cl. ................................ 204/192 E; 156/345; 156/643; 204/298
[58] Field of Search ........................... 204/192 E, 298; 156/643, 345

[56] References Cited

U.S. PATENT DOCUMENTS

| | | | |
|---|---|---|---|
| 2,594,243 | 7/1971 | Deutsch et al. | 156/643 |
| 3,627,599 | 12/1971 | Goldmacher | 156/643 |
| 4,025,411 | 5/1977 | Hom-ma et al. | 156/643 |
| 4,126,712 | 11/1978 | Poliniak | 204/192 E |
| 4,153,741 | 5/1979 | Poliniak et al. | 204/192 E |
| 4,268,374 | 5/1981 | Lepselter | 204/192 E |
| 4,278,753 | 7/1981 | Lewis et al. | 156/643 |
| 4,333,793 | 6/1982 | Lifshitz et al. | 156/643 |

FOREIGN PATENT DOCUMENTS

| | | | |
|---|---|---|---|
| 54-14679 | 7/1977 | Japan | 204/298 |
| 54-162929 | 12/1979 | Japan | 204/192 E |

OTHER PUBLICATIONS

Petrak, IBM Tech. Disc. Bull., 20 (1977), p. 1176.
Sonn et al., Rev. Sci. Inst., 42 (1971), pp. 1076–1077.
Bowden et al., J. Elect. Soc., 121 (1974), pp. 1620–1623.

Primary Examiner—Arthur P. Demers
Attorney, Agent, or Firm—Lucian C. Canepa

[57] ABSTRACT

In a plasma-assisted etching apparatus and method, surfaces in the reaction chamber are covered with a layer of a polyarylate polymer. Contamination of wafers during the etching process is thereby substantially reduced. In practice, this leads to a significant increase in the yield of acceptable chips per wafer.

32 Claims, 2 Drawing Figures

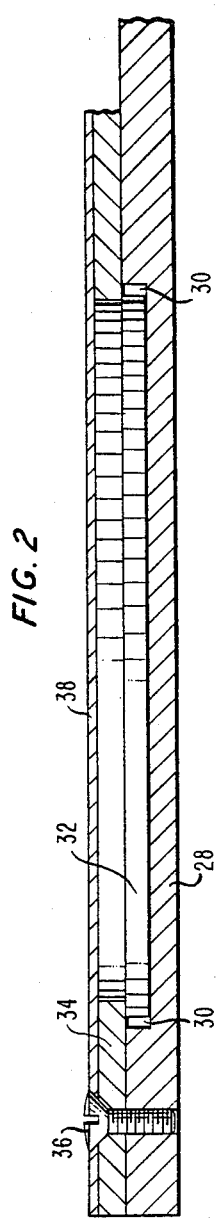

APPARATUS AND METHOD FOR PLASMA-ASSISTED ETCHING OF WAFERS

BACKGROUND OF THE INVENTION

This invention relates to the fabrication of microminiature devices and, more particularly, to an apparatus and a method in which fine-line patterns for integrated circuits are precisely delineated by dry etching processes.

Considerable interest exists in employing dry processing techniques for patterning workpieces such as semiconductor wafers. The interest in dry processing stems from its generally better resolution and improved dimensional and shape control capabilities relative to standard wet etching. Thus, dry etching is being utilized increasingly for, for example, fine-line pattern delineation in the processing of semiconductor wafers to form very large-scale-integrated (VLSI) devices.

Various dry etching processes that involve radio-frequency (rf)-generated plasmas in a reaction chamber are known. These so-called plasma-assisted processes include reactive sputter (or ion) etching. In reactive sputter etching, the workpieces to be patterned are placed on the rf-driven cathode electrode in the reaction chamber. In another plasma-assisted process, typically referred to as plasma etching, the workpieces are placed on the grounded anode electrode in the reaction chamber. These and other processes suitable for making VLSI devices are described by, for example, C. M. Melliar-Smith and C. J. Mogab in "Plasma-Assisted Etching Techniques for Pattern Delineation," *Thin Film Processes*, edited by J. L. Vossen and W. Kern, Academic Press, New York, 1978, pages 497 to 552.

As heretofore practised, plasma-assisted etching processes designed to pattern micron and sub-micron features in VLSI devices have often been plagued with relatively poor yield characteristics. One major obstacle to achieving better results in these processes has been the seemingly unavoidable presence of contaminants in the reaction chamber of the etching apparatus. These contaminants constitute, for example, pieces of material etched away from various surfaces in the reaction chamber or chemical fragments that are generated in the chamber during etching. Such contaminants can, for example, deposit on the surface of a selectively masked layer to be etched and thereby effectively inhibit etching of the unmasked portions of the layer that underlie the deposited contaminants. As a result, the pattern etched in the contaminated layer may not be a precise reproduction of the pattern formed in the overlying mask. In many cases of practical importance, the portions of the layer that are prevented by contaminants from being etched away result in unacceptable patterns being delineated in the devices under fabrication. Or some of these unetched portions, constituting slivers or so-called "grass" regions, may break off or be transported laterally or penetrate subsequent layers during the device fabrication sequence, thereby causing faults in the devices.

For these and other reasons, considerable efforts have been directed by workers in th art aimed at trying to reduce contamination effects in the reaction chamber of a plasma-assisted etching apparatus. It was recognized that such efforts, if successful, would increase the yield and thereby decrease the cost of devices made in accordance with a fabrication sequence that includes dry patterning steps carried out in such etching apparatus.

SUMMARY OF THE INVENTION

Hence, an object of the present invention is an improved etching apparatus and method. More specifically, an object of this invention is a plasma-assisted etching apparatus and method characterized by low contamination in the reaction chamber of the apparatus during the etching process.

Briefly, these and other objects of the present invention are realized in a specific illustrative plasma-assisted etching apparatus designed to pattern a variety of layers in a plasma. In accordance with a feature of the invention, at least some of the surfaces in the reaction chamber of the apparatus are covered with a layer of a polyarylate polymer such as Ardel. Contamination of wafers during the etching process is thereby substantially reduced.

BRIEF DESCRIPTION OF THE DRAWING

A complete understanding of the present invention and of the above and other features thereof may be gained from a consideration of the following detailed description presented hereinbelow in connection with the accompanying drawing, in which:

and FIG. 2 is a cross-sectional depiction of a portion of the FIG. 1 apparatus.

DETAILED DESCRIPTION

Figure 1:
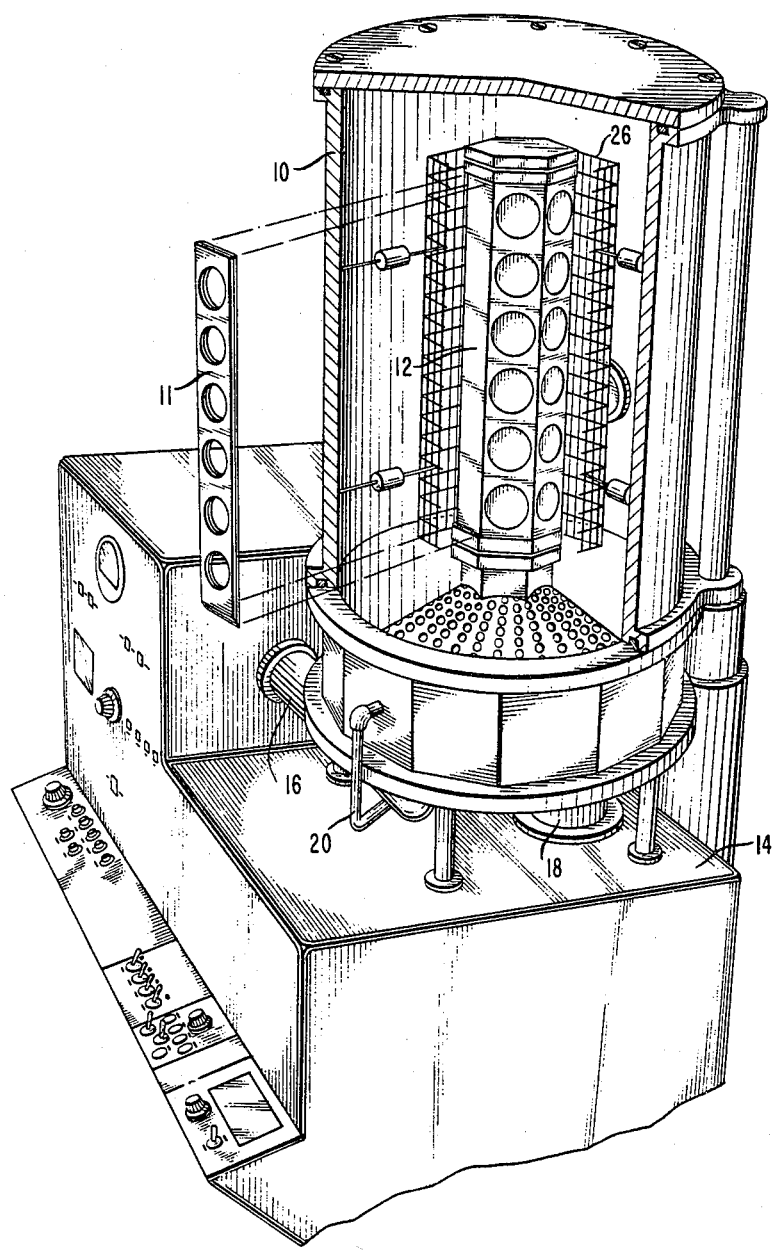
FIG. 1 shows a specific illustrative plasma-assisted etching apparatus made in accordance with the principles of the present invention.

The principles of the present invention are applicable to the improvement of both standard plasma etching equipment and methods and standard reactive sputter etching equipment and methods. Herein, for purposes of a specific illustrative example, emphasis will primarily be directed to reactive sputter etching equipment that embodies the principles of applicant's invention. It should be clearly understood, however, that these principles are also advantageously applicable to plasma etching apparatus.

Moreover, various configurations of reactive sputter etching apparatus are known. These include so-called parallel-plate or pancake reactors of the type described in U.S. Pat. No. 3,598,710 and so-called multifaceted cylindrical reactors of the type described in a copending commonly assigned U.S. patent application of D. Maydan designated Ser. No. 105,620, filed Dec. 20, 1979, now U.S. Pat. No. 4,298,443 issued Nov. 3, 1981. For purposes of a specific illustrative example, emphasis herein will primarily be directed to a reactor of the multifaceted cylindrical type. But it should be clearly understood that the principles of applicant's invention are also advantageously applicable to other reactors such as those of the parallel-plate type.

A specific illustrative multifaceted reactive sputter etching apparatus that embodies applicant's inventive principles is depicted in FIG. 1. In its overall configuration, the FIG. 1 apparatus is basically the same as that described in the aforecited Maydan application. The main difference between the apparatus shown in FIG. 1 and prior such equipment attributable to others resides in the fact that surfaces in the reaction chamber of FIG. 1 are covered with a layer, for example a sheet, of a polyarylate polymer. For a variety of etching processes, for example those specified later below, such a layer has been determined to impart a particularly advantageous low-contamination characteristic to the etching process carried out in the depicted reaction chamber.

As described in detail in the aforecited Maydan application, the specific illustrative etching system depicted in FIG. 1 comprises a reaction chamber defined in part by a cylindrical housing 10 made of an electrically conductive material such as, for example, aluminum or stainless steel. The housing 10 can be raised upwards to provide access to a workpiece holder 12 that is centrally mounted within the depicted structure. The particular illustrative holder 12 shown in FIG. 1 includes six flat surfaces or facets. By way of a specific example, each such surface indicated in FIG. 1 is designed to have six 4-inch wafers mounted thereon. A tray or wafer-containing assembly 11 for mounting the wafers on the holder 12 will be described in more detail in connection with FIG. 2.

Auxiliary equipment 14 constituting a part of the overall etching system shown in FIG. 1 includes a conduit 16 that contains therein fluid-carrying pipes and a conductive bus. The fluid carried in the pipes is utilized to cool the workpiece holder 12, and the bus is for the purpose of capacitively coupling a high-frequency potential to the holder 12.

Conduit 18 (FIG. 1), which is connected to a standard vacuum pump in the equipment 14, serves to establish a prescribed low-pressure condition in the housing 10. In addition, an inlet pipe 20 is utilized to introduce a specified gas or mixture of gases into the depicted chamber from the equipment 14.

The aforementioned bus is connected to the workpiece holder 12 shown in FIG. 1, and the housing 10 is connected to a fixed point of reference potential such as electrical ground. The workpiece holder 12 constitutes the cathode and the housing 10 constitutes the anode of the depicted apparatus. As is well known, the anode-to-cathode area ratio is designed to exceed unity.

The FIG. 1 apparatus may also advantageously include a grid element 26 whose structure and function are described in detail in the aforecited Maydan application.

The wafer-mounting tray 11 of FIG. 1 is represented in more detail in FIG. 2. As indicated in FIG. 2, the tray 11 comprises a base plate 28 made, for example, of aluminum. Six wafer-holding recesses are formed in the plate 28. These recesses are typically cylindrical and just slightly larger in diameter than the respective wafers designed to be placed therein. The depth of the recesses is approximately the same as the thickness of the wafers. One such recess 30, having a wafer 32 therein, is indicated in FIG. 2. A top plate 34 containing six apertures therethrough in aligned registry with the recesses in the plate 28 is also shown in FIG. 2. Illustratively, the top plate 34 is secured to the base plate 28 by screws (one of which, designated 36, is shown in FIG. 2).

The diameter of each aperture in the top plate 34 is slightly less than the diameter of the wafer contained in the recess immediately thereunder. Accordingly, the plate 34 serves to retain the workpieces to be etched in place in the base plate 28. A major portion of the top surface of each retained workpiece is thereby exposed through its respective aperture in the plate 34. When the wafer-containing assemblies are secured in place on the facets of the holder 12, the exposed surfaces of the retained workpieces are mounted in place for etching in the apparatus of FIG. 1.

In accordance with the principles of the present invention, some or all of the internal surfaces in the reaction chamber of the FIG. 1 apparatus are covered with a layer of a polyarylate polymer. These surfaces include the surfaces of the top plates included in the wafer-holding assemblies (for example, the top plate 34 shown in FIG. 2), the inner surface of the housing 10 (FIG. 1), and other surfaces exposed to the etching plasma within the depicted reaction chamber.

To minimize contamination during etching, it is particularly important that the surfaces of the top plates included in the aforespecified wafer-holding assemblies be protectively covered. Hence, in accordance with the principles of this invention, at least the top plates of these assemblies are covered with a layer, for example a sheet, of a polyarylate polymer. (Of course, some or all of the other exposed surfaces in the reaction chamber may advantageously also be so covered.) Thus, as shown by way of example in FIG. 2, a layer 38 of a polyarylate polymer covers the top surface of the plate 34. Illustratively, the layer 38 comprises a standard commercially available one-sixteenth-inch-thick sheet of a polyarylate machined or otherwise shaped to conform to the top surface of the plate 34. Alternatively, the plate 34 may itself be machined from a bar or otherwise formed (for example, molded) to form a suitably shaped one-half-inch-thick plate of a polyarylate polymer. In that case, of course, a separate top sheet 38 overlying the plate 34 is not required.

In accordance with the principles of the present invention, polyarylate polymers have been determined to be especially well suited for use in the reaction chamber of a plasma-assisted etching apparatus. In particular, these polymers have been determined to be advantageous for patterning a variety of materials in plasma-assisted etching processes. Before, however, setting forth illustrative detailed information concerning these materials and etching plasmas therefor, more specific information concerning suitable polyarylate coverings for use in the reaction chamber of a plasma-assisted etching apparatus will be set forth.

Various high-temperature-tolerant polyarylate polymers are suitable for inclusion in the reaction chamber of a reactive sputter etching apparatus made in accordance with the principles of the present invention. One advantageous such polymer, designated Ardel, is made by and available in pellet form from Union Carbide, Bound Brook, New Jersey. In turn, the Ardel polymer pellets are processed by a number of commercial fabricators who convert the pellet-form material into strips, ribbons, plates or sheets. One source of converted Ardel, for example in the form of one-eighth-inch-thick sheets, is Westlake Plastics, Lenni, Pennsylvania.

Ardel polymer is available from Union Carbide in various types which are respectively designated Ardel 100, Ardel 203, Ardel 205 and Ardel 208. All are suitable for inclusion in the herein-specified reaction chambers to minimize contamination during plasma-assisted etching. For purposes of a specific illustrative example, it will be assumed herein wherever only the generic designation Ardel is utilized that Ardel 100 is intended.

Other high-temperature-tolerant polymers suitable for inclusion in the herein-specified reaction chambers in the form of sheets, bars, ribbons, strips, etc. to cover surfaces in the chambers include: U-Polymer, a polyarylate polymer made by Unitika Ltd., London, England; and Ekonol Polymer (high-type, low-type or filled polytetrafluoroethylene-type) made by Carborundum Company, Niagara Falls, New York.

In accordance with the principles of this invention, a polyarylate polymer such as Ardel can be applied to surfaces made, for example, of aluminum, magnesium, titanium, stainless steel, ceramic, plastic or glass. Coverings so applied, for example by screwing, riveting or adhesive bonding, are characterized by high density, low porosity, good adherence to the underlying substrate and excellent structural integrity even under the harsh conditions typically present in the reaction chamber of a plasma-assisted etching apparatus.

In accordance with the principles of the present invention, polyarylate polymer members of various thicknesses can be utilized to cover surfaces in the reaction chamber of a plasma-assisted etching apparatus. For one specific illustrative reactive sputter etching apparatus in which surfaces in the reaction chamber were covered with Ardel, the covering thickness was advantageously established at approximately one-sixteenth of an inch.

Applicant has discovered that polyarylate polymer members of the type specified above and Ekonol Polymer are particularly well suited for use in the reaction chamber of a plasma-assisted apparatus designed to pattern layers of various materials. In practice, such members have been determined to produce very little, if any, contamination of VLSI wafers during dry etching of the layers.

More specifically, in accordance with the principles of the present invention, polyarylate polymer members have been found to be advantageous for inclusion in the reaction chamber of a reactive sputter etching apparatus during patterning of, for example, aluminum, polysilicon, silicon dioxide, resist and tantalum disilicide layers. For aluminum, the plasma is, illustratively, derived from a mixture of boron trichloride and chlorine gases. Such mixtures suitable for anisotropic etching of aluminum are described in detail in U.S. Pat. No. 4,256,534. (Optionally, a relatively small amount of helium may be added to the boron trichloride-chlorine mixture.) For polysilicon, the plasma is, for example, also derived from a mixture of boron trichloride and chlorine or from chlorine alone. For silicon dioxide, the plasma is, illustratively, derived from a mixture of trifluoromethane and ammonia. For hardened resist materials such as those utilized in the so-called trilevel process described in U.S. Pat. No. 4,244,799, the plasma is, for example, derived from oxygen and a halocarbon such as carbon tetrafluoride or from oxygen alone. For tantalum disilicide, the plasma comprises, illustratively, active etchant radicals that include fluorine and chlorine constituents as the predominant etchant species for tantalum and silicon, respectively, as described in a copending commonly assigned application of J. Deslauriers and H. J. Levinstein, Ser. No. 266,433, filed May 22, 1981.

By utilizing a polyarylate polymer to cover surfaces in the reaction chamber of a plasma-assisted etching apparatus, layers of still other materials included in VLSI device structures may also be patterned in a substantially contamination-free, and therefore high-yield, manner. Such other materials capable of being so etched include: silicon nitride, phosphosilicate glass, boron nitride, single-crystal silicon, tantalum and tungsten.

In one specific illustrative example in which an aluminum layer was anisotropically etched in a chamber that included surfaces covered with Ardel, the aforementioned gas mixture included 75 percent by volume boron trichloride and 25 percent by volume chlorine. (Boron trichloride percentages in the range 0-to-90 percent and chlorine percentages in the range 100-to-10 also provide satisfactory results. Optionally, approximately 0-to-5 percent helium may also be included.) The flow of the mixture into the chamber approximated 75 cubic centimeters per minute. (A flow in the range 50-to-100 cubic centimeters per minute is satisfactory.) The pressure in the chamber was maintained at about 20 micrometers. (Satisfactory operation may also be carried out at a pressure in the range 5-to-50 micrometers.) The power per square centimeter at the surface to be etched was established at approximately 0.15 watts per square centimeter. (A power density in the range 0.1-to-0.2 watts per square centimeter is satisfactory.) The direct-current bias of the cathode or wafer-holding electrode with respect to ground was measured to be about 210 volts. (A bias voltage in the range 60-to-350 volts dc is satisfactory.) Under these particular conditions, the aluminum layer was anisotropically etched in a substantially contamination-free manner at a rate of approximately 800 Angstrom units per minute.

In a VLSI structure that includes both aluminum and polysilicon layers to be etched, the polysilicon layer may also be anisotropically patterned in a plasma derived from the aforespecified boron trichloride-chlorine gas mixtures in a chamber that includes surfaces covered with Ardel. Alternatively, the polysilicon layer may be etched in such a chamber in other plasmas.

An advantageous alternative plasma in which to etch polysilicon is derived from chlorine gas, as described in detail in a copending commonly assigned U.S. application of D. Maydan and D. N. Wang, application Ser. No. 119,103, filed Feb. 6, 1980. For undoped polysilicon, the edge profile of the etched material is anisotropic; for doped polysilicon, the edge profile can be controlled to occur in the range from completely isotropic to completely anisotropic, as set forth in the Maydan-Wang application.

In one specific illustrative example in which an undoped polysilicon layer was anisotropically etched in a chamber that included surfaces covered with Ardel, the etching plasma was derived from an essentially pure chlorine gas atmosphere. The flow of the mixture into the chamber approximated 40 cubic centimeters per minute. (A flow in the range 20-to-80 cubic centimeters per minute is satisfactory.) The pressure in the chamber was maintained at about 10 micrometers. (Satisfactory operation may also be carried out at a pressure in the range 5-to-40 micrometers.) The power per square centimeter at the surface to be etched was established at approximately 0.1 watts per square centimeter. (A power density in the range 0.05-to-0.2 watts per square centimeter is satisfactory.) The direct-current bias of the cathode or wafer-holding electrode with respect to ground was measured to be about 300 volts. (A bias voltage in the range 60-to-350 volts dc is satisfactory.) Under these particular conditions, the polysilicon layer was anisotropically etched in a substantially contamination-free manner at a rate of approximately 500 Angstrom units per minute.

In another specific illustrative example in which a silicon dioxide layer was anisotropically etched in a chamber that included surfaces covered with Ardel, the etching plasma was derived from a mixture that included 96 volume percent trifluoromethane and 4 volume percent ammonia. The flow of the mixture into the chamber approximated 30 cubic centimeters per minute. (A flow in the range 5-to-70 cubic centimeters per minute is satisfactory.) The pressure in the chamber was maintained at about 50 micrometers. (Satisfactory operation may also be carried out at a pressure in the range 5-to-100 micrometers.) The power per square centimeter at the surface to be etched was established at approximately 0.16 watts per square centimeter. (A power density in the range 0.1-to-0.3 watts per square centimeter is satisfactory.) The direct-current bias of the cathode or wafer-holding electrode with respect to ground was measured to be about 600 volts. (A bias voltage in the range 400-to-800 volts dc is satisfactory.) Under these particular conditions, the silicon dioxide layer was anisotropically etched in a substantially contamination-free manner at a rate of approximately 300 Angstrom units per minute.

Finally, it is to be understood that the above-described arrangements and procedures are only illustrative of the principles of the present invention. In accordance with these principles, numerous modifications and alternatives may be devised by those skilled in the art without departing from the spirit and scope of the invention. Thus, for example, although primary emphasis herein has been directed to surfaces covered with sheets of a polyarylate polymer such as Ardel, it is to be understood these surfaces can also be covered in other standard ways known in the art (for example, by spraying).

In two copending commonly assigned applications, other materials are disclosed for coating surfaces in the reaction chamber of a plasma-assisted etching apparatus to achieve low-contamination etching of specified layers. The two applications are designated H. J. Levinstein-F. Vratny Ser. Nos. 295,531 and 295,650, both filed on Aug. 24, 1981.

What is claimed is:

1. Apparatus for plasma-assisted dry etching of a layer formed on a wafer, said apparatus comprising
a reaction chamber,
means for establishing an etching plasma within said chamber,
said chamber including surfaces exposed to said plasma,
and a covering of a polyarylate polymer on at least some of said surfaces.

2. An apparatus as in claim 1 wherein said polymer is selected from the group consisting of Ardel 100, Ardel 203, and Ardel 205, Ardel 208, U-Polymer.

3. An apparatus as in claim 2 further including a cathode electrode in said reaction chamber,
and means including polyarylate polymer-covered surfaces mounting said wafer on said cathode electrode.

4. An apparatus as in claim 3 wherein said wafer includes a layer of aluminum to be etched,
and wherein said establishing means includes means for introducing a mixture of boron trichloride and chlorine gases into said reaction chamber.

5. An apparatus as in claim 3 wherein said wafer includes a layer of polysilicon to be etched,
and wherein said establishing means includes means for introducing a mixture of boron trichloride and chlorine gases into said reaction chamber.

6. An apparatus as in claim 3 wherein said wafer includes a layer of polysilicon to be etched,
and wherein said establishing means includes means for introducing essentially pure chlorine gas into said reaction chamber.

7. An apparatus as in claim 3 wherein said wafer includes a layer of silicon dioxide to be etched,
and wherein said establishing means includes means for introducing a mixture of trifluoromethane and ammonia gases into said reaction chamber.

8. An apparatus as in claim 3 wherein said wafer includes a layer of hardened resist material to be etched,
and wherein said establishing means includes means for introducing a halocarbon and/or oxygen into said reaction chamber.

9. An apparatus as in claim 3 wherein said wafer includes a layer of tantalum disilicide to be etched;
and wherein said establishing means includes means for introducing into said reaction chamber a gas from which are derived active etchant radicals that include fluorine and chlorine constituents as the predominant etchant species for tantalum and silicon, respectively.

10. An apparatus as in claim 4 wherein said establishing means includes means for establishing the following conditions in said reaction chamber: a pressure of approximately 20 micrometers, a power density of approximately 0.15 watts per square centimeter at the surface of the layer to be etched, a gas flow into said chamber of approximately 75 volume percent boron trichloride and 25 volume percent chlorine, a gas flow into said chamber of approximately 75 cubic centimeters per minute and a dc bias voltage of said cathode electrode with respect to a point of reference potential of approximately 210 volts.

11. An apparatus as in claim 6 wherein said establishing means includes means for establishing the following conditions in said reaction chamber: a pressure of approximately 10 micrometers, a power density of approximately 0.1 watts per square centimeters at the surface of the layer to be etched, a gas flow into said chamber of approximately 40 cubic centimeters per minute and a dc bias voltage of said cathode electrode with respect to a point of reference potential of approximately 300 volts.

12. An apparatus as in claim 7 wherein said establishing means includes means for establishing the following conditions in said reaction chamber: a pressure of approximately 50 micrometers, a power density of approximately 0.16 watts per square centimeter at the surface of the layer to be etched, a gas flow into said chamber of approximately 96 volume percent trifluoromethane and 4 volume percent ammonia, a gas flow into said chamber of approximately 30 cubic centimeters per minute and a dc bias voltage of said cathode electrode with respect to a point of reference potential of approximately 600 volts.

13. Apparatus for plasma-assisted dry etching of a layer on a wafer that is to be processed to form multiple integrated circuits, said apparatus comprising
a reaction chamber,
means for establishing an etching plasma within said chamber,
means within said chamber for holding a number of wafers to be etched,
said chamber having internal surfaces including surfaces of said holding means in the immediate vicinity of said wafers to be etched,
and a layer of a high-temperature-tolerant polyarylate polymer formed on internal surfaces including at least the surfaces of said holding means in the immediate vicinity of said wafers.

14. Apparatus as in claim 13 wherein said plasma is derived from a mixture of boron trichloride and chlorine.

15. Apparatus as in claim 13 wherein said plasma is derived from essentially pure chlorine.

16. Apparatus as in claim 13 wherein said plasma is derived from a mixture of trifluoromethane and ammonia.

17. Apparatus as in claim 13 wherein said plasma is derived from oxygen or a halocarbon and oxygen.

18. Apparatus as in claim 13 wherein said establishing means includes means for introducing into said reaction chamber a gas from which are derived active etchant radicals that include fluorine and chlorine as the predominant etchant species.

19. A method for fabricating VLSI devices by delineating fine-line patterns on a wafer in accordance with a process sequence that includes plasma-assisted dry etching, said method comprising the steps of
mounting said wafer to be etched in a reaction chamber at least some of whose surfaces are covered with a layer of a polyarylate polymer,
and establishing an etching plasma within said chamber.

20. A method as in claim 19 wherein said polymer is selected from the group consisting of Ardel 100, Ardel 203, Ardel 205, Ardel 208 and U-Polymer.

21. A method as in claim 20 wherein a cathode electrode is included in said reaction chamber and said wafer to be etched is mounted on said cathode electrode.

22. A method as in claim 21 wherein said wafer includes a layer of aluminum to be etched,
and wherein said establishing step includes introducing a mixture of boron trichloride and chlorine gases into said chamber.

23. A method as in claim 21 wherein said wafer includes a layer of polysilicon to be etched,
and wherein said establishing step includes introducing a mixture of boron trichloride and chlorine gases into said chamber.

24. A method as in claim 21 wherein said wafer includes a layer of polysilicon to be etched,
and wherein said establishing step includes introducing essentially pure chlorine gas into said chamber.

25. A method as in claim 21 wherein said wafer includes a layer of silicon dioxide to be etched,
and wherein said establishing step includes introducing a mixture of trifluoromethane and ammonia gases into said chamber.

26. A method as in claim 21 wherein said wafer includes a layer of hardened resist material to be etched,
and wherein said establishing step includes introducing a halocarbon and/or oxygen into said chamber.

27. A method as in claim 21 wherein said wafer includes a layer of tantalum disilicide to be etched,
and wherein said establishing step includes introducing into said chamber a gas from which are derived active etchant radicals that include fluorine and chlorine constituents as the predominant etchant species for tantalum and silicon, respectively.

28. A method as in claim 22 wherein said establishing step includes establishing the following conditions within said chamber: a pressure of approximately 20 micrometers, a power density of approximately 0.15 watts per square centimeter at the surface of the layer to be etched, a gas flow into said chamber of approximately 75 volume percent boron trichloride and 25 volume percent chlorine, a gas flow into said chamber of approximately 75 cubic centimeters per minute and a dc bias voltage of said cathode electrode with respect to a point of reference potential of approximately 210 volts.

29. A method as in claim 24 wherein said establishing step includes establishing the following conditions within said chamber: a pressure of approximately 10 micrometers, a power density of approximately 0.1 watts per square centimeter at the surface of the layer to be etched, a gas flow into said chamber of approximately 40 cubic centimeters per minute and a dc bias voltage of said cathode electrode with respect to a point of reference potential of approximately 300 volts.

30. A method as in claim 25 wherein said establishing step includes establishing the following conditions within said chamber: a pressure of approximately 50 micrometers, a power density of approximately 0.16 watts per square centimeter at the surface of the layer to be etched, a gas flow into said chamber of approximately 96 volume percent trifluoromethane and 4 volume percent ammonia, a gas flow into said chamber of approximately 30 cubic centimeters per minute and a dc bias voltage of said cathode electrode with respect to a point of reference potential of approximately 600 volts.

31. Apparatus for plasma-assisted dry etching of a layer formed on a wafer, said apparatus comprising
a reaction chamber,
means for establishing an etching plasma within said chamber,
said chamber including surfaces exposed to said plasma, and a covering of Ekonol Polymer on at least some of said surfaces.

32. A method for fabricating VLSI devices by delineating fine-line features on a wafer in accordance with a process sequence that includes plasma-assisted dry etching, said method comprising the steps of
mounting said wafer to be etched in a reaction chamber at least some of whose surfaces are covered with a layer of Ekonol Polymer,
and establishing an etching plasma within said chamber.

* * * * *